United States Patent [19]

Robinson

[11] Patent Number: 5,572,396
[45] Date of Patent: Nov. 5, 1996

[54] ELECTRIC SERVICE SAFETY DISCONNECT APPARATUS WITH OVERVOLTAGE AND OVERCURRENT PROTECTION

[75] Inventor: Darrell Robinson, Highland Township, Mich.

[73] Assignee: Ekstrom Industries, Inc., Farmington Hills, Mich.

[21] Appl. No.: 425,887

[22] Filed: Apr. 21, 1995

[51] Int. Cl.⁶ .................................. H02B 1/26; H02H 1/04
[52] U.S. Cl. ............................ 361/93; 361/127; 361/661; 361/56
[58] Field of Search ....................... 361/93–95, 102–105, 361/111–112, 117–118, 56, 91, 126–127, 641, 643, 659–661, 668

[56] References Cited

U.S. PATENT DOCUMENTS

| | | | |
|---|---|---|---|
| 3,725,745 | 4/1973 | Zisa | 361/127 |
| 4,264,897 | 4/1981 | Farnsworth | 340/870.29 |
| 4,359,684 | 11/1982 | Ley | 324/142 |
| 4,413,306 | 11/1983 | Erickson | 361/648 |
| 4,532,574 | 7/1985 | Reiner et al. | 361/660 |
| 4,591,779 | 5/1986 | Carpenter, Jr. et al. | 323/301 |
| 4,630,163 | 12/1986 | Cooper et al. | 361/56 |
| 4,866,560 | 9/1989 | Allina | 361/104 |
| 4,875,137 | 10/1989 | Rozanski et al. | 361/127 |
| 4,901,187 | 2/1990 | Allina | 361/117 |
| 4,907,119 | 3/1990 | Allina | 361/56 |
| 4,931,895 | 6/1990 | Allina | 361/56 |
| 4,944,692 | 7/1990 | Allina | 439/517 |
| 4,977,482 | 12/1990 | Langdon et al. | 361/661 |
| 5,006,950 | 4/1991 | Allina | 361/117 |
| 5,023,747 | 6/1991 | Lindsay | 361/117 |
| 5,045,969 | 9/1991 | Menasco | 361/672 |
| 5,097,383 | 3/1992 | Heard et al. | 361/662 |
| 5,124,873 | 6/1992 | Wheeler et al. | 361/58 |
| 5,129,841 | 7/1992 | Allina et al. | 439/517 |
| 5,130,884 | 7/1992 | Allina | 361/117 |
| 5,140,491 | 8/1992 | Allina | 361/56 |
| 5,148,345 | 9/1992 | Allina | 361/104 |
| 5,216,802 | 6/1993 | Cole et al. | 29/825 |

OTHER PUBLICATIONS

Ekstrom Relay and Switch Adapters, Bulletin El–RA–191–5m.
Ekstrom Service Limiter Adapter, Bulletin EL–SL–191–5m.
Ekstrom Temporary Metered Power Device, EK–TMP–991–2m.
Ekstrom Bulletin 5007, Jun. 1982.

Primary Examiner—Jeffrey A. Gaffin
Assistant Examiner—Michael J. Sherry
Attorney, Agent, or Firm—Young & Basile P.C.

[57] ABSTRACT

A socket adapter housing has a plurality of line and load blade terminals and jaw contacts. An electrical power disconnect device, mounted in the housing, has contacts switchable between closed and open states, the contacts being serially connected between the line blade terminals and the line jaw contacts. Rigid bus bars are fixedly connected to terminals on the power disconnect device extending from the switchable contacts and to the line blade and line jaws to fixedly mount the power disconnect device in the socket adapter housing. Surge suppression devices are connected between the load blade terminals and ground potential. An insulating safety shield is mounted in the housing and completely surrounds the line and load jaw contacts. Alternately, the housing includes a watthour meter receiving portion containing the power disconnect means and the line and load blade terminals and jaw contacts. An auxiliary housing is affixed along with the watthour meter receiving housing to a common base and contains the surge suppression devices. A cover is removably mountable on the auxiliary housing.

24 Claims, 5 Drawing Sheets

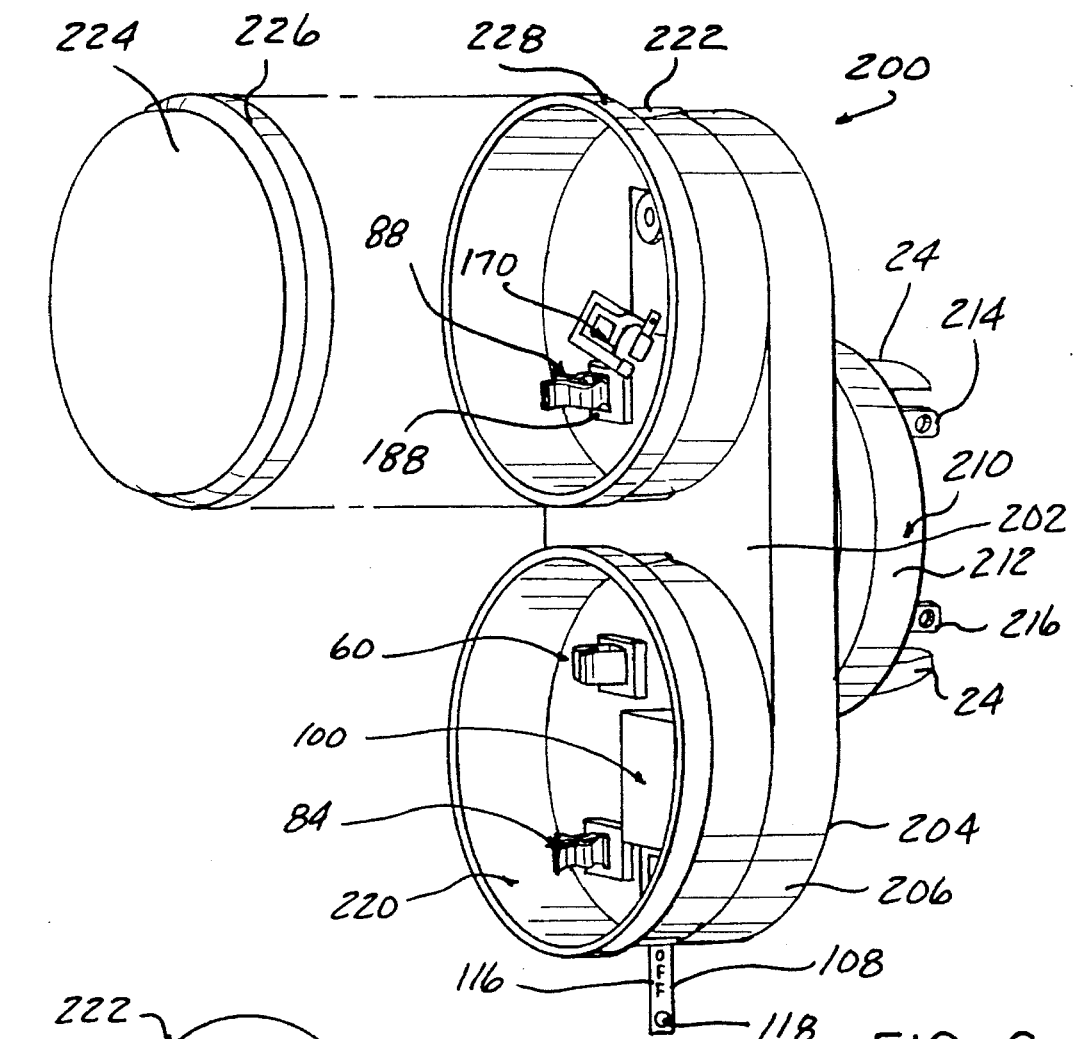
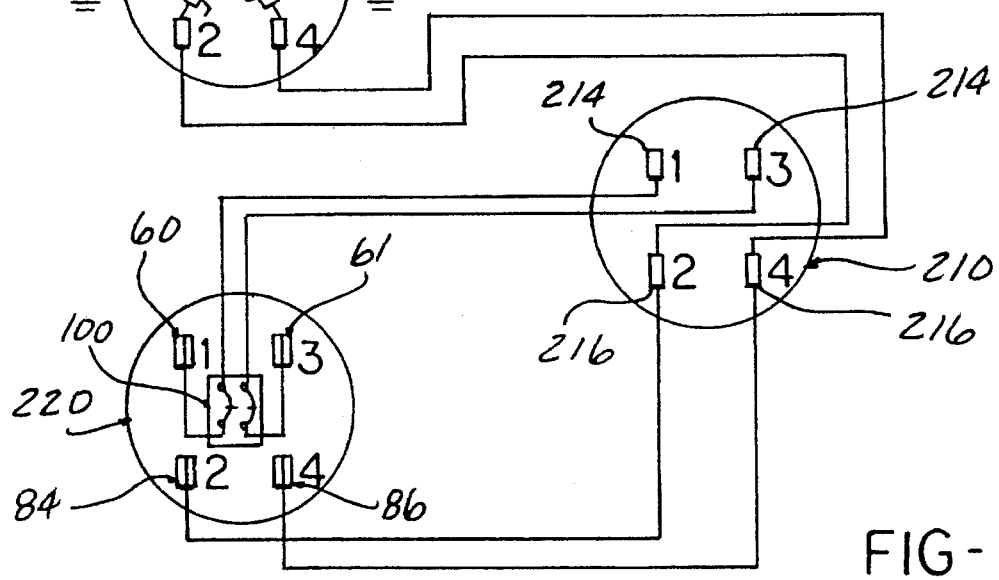
FIG-6
FIG-7

ELECTRIC SERVICE SAFETY DISCONNECT APPARATUS WITH OVERVOLTAGE AND OVERCURRENT PROTECTION

CROSS-REFERENCE TO RELATED APPLICATIONS

This application contains subject matter which is also disclosed in U.S. patent applications, Ser. No. 08/274,486, entitled "METERED ELECTRICAL SERVICE TAP" and application Ser. No. 08/215,915, entitled "WATTHOUR METER MOUNTING APPARATUS WITH SAFETY SHIELD".

BACKGROUND OF THE INVENTION

1. Field of the Invention

The present invention relates, in general, to electric power service to homes and buildings and, more specifically, to overvoltage and/or overcurrent devices used with watthour meters mounted in watthour meter sockets at homes and buildings.

2. Description of the Art

Electrical power is supplied to an individual site or service by external electrical power line conductors located above or below ground. In a conventional arrangement, electrical power line conductors are connected to contacts in a watthour meter socket mounted on a building wall. Electrical load conductors are connected to another set of contacts in the meter socket and extend to the electrical distribution network in the building. A watthour meter is connected into the contacts in the meter socket to measure the electric power drawn through the load conductors.

Due to the current trend toward the use of plug-in watthour meters, A to S type socket adapters have been devised which convert A-base type bottom connected watthour meter sockets to receive plug-in watthour meters. Another type of socket adapter has been devised which allows the installation of other devices between the watthour meter socket and a plug-in watthour meter.

Such watthour meter socket adapters have also been provided with power disconnect devices, such as circuit breakers or ground fault circuit interrupters, both for protecting the electrical service as well as, in certain applications, to limit the amount of power supplied to the site. Such power disconnect devices may include an elongated plunger, the end of which extends outwardly through an opening in the annular side wall of the socket adapter when the circuit breaker is in the open or power disconnected position. The exposed end of the plunger can be pushed through the side wall of the watthour meter socket adapter to close the circuit breaker and to reapply power to the site. In certain of these devices, the ends of the plungers extending through the sidewall of the adapter have been colored red for high visibility of a tripped or open condition of the circuit breaker, etc.

Many older homes and buildings, even where originally wired with bottom connected watthour meters, have been converted by electrical utilities to socket style meters by the use of the above-described A to S socket adapter. This type of socket adapter does not require the existing wires to be moved which could cause the insulation which has become brittle with age to fall apart exposing the conductor. If this happens, the conductors and the socket itself need to be replaced which is a time consuming and costly process. This also creates further problems since the service entrance cables into the building should also be replaced and so on down the line through the distribution network as individual conductors are moved.

Currently, homes and buildings often have various electrically powered devices, such as a large number of appliances, computers, medical systems, video display systems, etc., which were not envisioned when the original distribution network conductors were sized to meet a particular maximum load at the time of the original installation. Older homes and buildings have been wired with smaller gauge wires, as small as #12 AWG, with up to and including #6 AWG also being common. The amperage usage in many of these systems exceeds the safe capacity of the individual wires or conductors. Further, due to the age of such wiring installations, the insulation on the individual wires typically is brittle and any movement of the wires for service upgrade could lead to the aforementioned deterioration or separation of the insulation from the wires which could lead to arcing between adjacent conductive elements and electrical fires.

One method to reduce fires in older installations where the insulation on the system wires is deteriorating is to prevent the system voltage levels from becoming too high and arcing. A socket type watthour meter has built-in surge air gaps will generally arc across the gaps at about 2,500 to 5,000 volts in the event of a voltage surge or transient thereby protecting the wiring system up to this voltage level. However, surge or transient voltages less than this level can often cause arcing between the building wires where the wire insulation has deteriorated. Once arcing begins, the arc itself can eventually form a conductive path and fault thereby creating a potential fire hazard. Of course, it is also important that voltage surges and transients be blocked from the distribution system to protect the electrical appliances and electronic devices attached thereto.

To address this problem, current limiting fuses and circuit breakers have been connected by small wires between the load jaw contacts and load blade terminals in the socket adapter to create an open circuit at excessive amperage levels. Other surge voltage limiting devices have been connected between the line jaw contacts or blade terminals and ground to shunt voltage surges and transients to ground before such excessive voltages reach the watthour meter or load distribution network.

One such watthour meter base surge suppression system is disclosed in U.S. Pat. No. 5,023,747, assigned to EFI Electronics Corporation, Salt Lake City, Ut. In this device, a pair of surge suppressors in the form of metal oxide varistors are each connected to an electrical contact element which contains a slot to enable the contact element to be disposed about and in contact with the line blade terminals extending from the jaw contacts in the shell of the socket adapter through the base and outward for insertion into the jaw contacts of a watthour meter socket. Voltage surges present on the line blade terminals are conducted via the metal oxide varistors to respective fuses in the form of fusible links and then to ground to prevent the surges from being transmitted through the watthour meter and onto the electrical load distribution network. This surge suppression system also includes a diagnostic circuit which couples the varistors to an audible signal generator, such as a buzzer, which indicates that one of the fusible links has ruptured upon the occurrence of a line surge.

While this watthour meter surge suppression system has proven to be effective, it is believed that further improvements could be made to such a system to enhance the overvoltage and overcurrent protection of an electrical power service.

Thus, it would be desirable to provide a watthour meter socket adapter having both overvoltage and overcurrent protection which can be installed in a watthour meter socket without disturbing existing socket wiring. It would also be desirable to provide a watthour meter socket adapter which provides both overvoltage protection on the load side of a watthour meter and overcurrent protection on the line side of the watthour meter. It would also be desirable to provide such a watthour meter socket adapter which has lockout features with a visual lockout indicator to insure that electrical power is completely disconnected from the load distribution network during wiring changes,

SUMMARY OF THE INVENTION

The present invention is an electric service disconnect apparatus having overcurrent and overvoltage protection, The apparatus includes a housing having a hollow interior, A plurality of line and load jaw contacts are mounted in the housing for receiving the line and load blade terminals of a watthour meter, A plurality of line and load blade terminals are also mounted in the housing and extend outward from the housing for insertion into electrical connection with jaw contacts in a watthour meter socket, Surge suppression means are mounted in the housing and coupled between ground potential and the load blade terminals for conducting electrical surges and transients to ground, An electrical power disconnect means is also mounted in the housing and serially connected between the line blade terminals and the line jaw contacts to provide overcurrent protection and to protect the surge suppression means should a fault occur in the surge suppression means, In a preferred embodiment, the housing is in the form of a watthour meter socket adapter having a base with a central wall and a peripheral mounting edge, A shell sized to receive a watthour meter has a bottom wall fixedly mounted on the peripheral edge of the base and an annular side wall extending axially from the base. The line blade terminals are mounted in the central wall of the base, The line jaw contacts are mounted in the bottom wall of the shell, The power disconnect means may be in the form of a circuit breaker which trips at a predetermined safe current or a ground fault circuit interrupter which trips in the event of a detected short circuit. The power disconnect means preferably includes switchable contacts each connected between one line blade terminal and one line jaw contact.

Electrical connectors, preferably in the form of rigid, electrically conductive bus bars, are fixedly connected to and extend between each line blade terminal in the base and the terminals of the switchable contacts of the power disconnect means, and between each line jaw contact in the shell and other terminals of the switchable contacts of the power disconnect means to serially connect the power disconnect means between the line blade terminals and the line jaw contacts. The rigid bus bars also fixed mount the power disconnect means within the socket adapter housing without requiring separate fastening or mounting means previously used to mount the power disconnect means directly to the housing.

The surge suppression means is preferably mounted in a hollow interior chamber formed between the bottom wall of the shell and the central wall of the base. Preferably, the surge suppression means comprises a plurality of metal oxide varistors, each of which is connected to one of the load blade terminals and ground potential.

In a preferred embodiment, the electrical power disconnect means includes an external plunger movable between two positions corresponding respectively to power conducting and non-power conducting states of the power disconnect means. The plunger or a separate rod movably coupled to the plunger has an end portion extending through the side wall of the shell when the power disconnect means is in the non-power conducting state. "Off" indicia is printed on the end portion of the plunger or the rod to indicate the non-power conducting state.

Further locking means may be provided for exteriorly locking the rod and/or plunger from movement to prevent the power disconnect means from being switched to the power conducting state. Preferably, the locking means includes an aperture formed in the end portion of the plunger or rod, which aperture is disposed externally of the side wall of the housing when the power disconnect means is in the non-power conducting state. A lock is insertable through the aperture to prevent movement of the rod or plunger and the resultant switching of the power disconnect device to a power conducting state.

In an alternate embodiment, an auxiliary housing, separate from the watthour meter receiving shell is also mounted on the base. The surge suppression means is disposed in the auxiliary housing and connected by electrical conductors to the load blade terminals and load jaw contacts in the shell and the base. A cover is removably attachable to the auxiliary housing to provide lockable access to the auxiliary housing separate from access to the watthour meter receiving shell.

The electrical power service disconnect with overvoltage and overcurrent protection of the present invention provides unique features not previously provided in a watthour meter socket adapter. The electrical connection of the power disconnect means with overcurrent detection between the line blade terminals and the line jaw contacts provides greater protection for existing wiring distribution networks, particularly such wiring distribution networks found in older homes which were typically wired for lower electrical power loads. This also protects the surge suppression devices should a fault occur on the surge suppression devices. Further, the surge suppression means are uniquely electrically connected in parallel with each load jaw blade terminal of the watthour meter socket adapter to ground potential to allow the air gaps in the watthour meter to first reduce any overvoltages from the utility power distribution network and to help extend the useful life of the surge suppression devices. The surge suppression means conducts any surges or transients after the watthour meter to ground to prevent such surges or transients from entering the building load distribution network.

Further, the use of rigid bus bar connectors to electrically connect the line jaw contacts and the line blade terminals to the terminals of the switchable contacts on the power disconnect means provides a fixed mounting for the power disconnect means in the socket adapter housing. This eliminates the need for separate fasteners or other mounting arrangements, and the associated installation labor, previously used to fixedly mount such power disconnect means or circuit breakers directly to the housing.

Further, the serial connection of the power disconnect means or circuit breaker to the line side conductors flow the impedance of the power disconnect or circuit breaker sensing circuit to provide additional surge suppression to the watthour meter in order to reduce the magnitude of any voltage surge or transients before the voltage surge or transients reach the watthour meter or the surge suppression circuit connected to the load side conductors.

BRIEF DESCRIPTION OF THE DRAWING

The various features, advantages and other uses of the present invention will become more apparent by referring to the following detailed description and drawing in which:

FIG. 6 is a partially exploded, perspective view of a second embodiment of the safety disconnect of the present invention; and FIG. 7 is a schematic diagram of the safety disconnect shown in FIG. 6.

DESCRIPTION OF THE PREFERRED EMBODIMENTS

Figure 1:
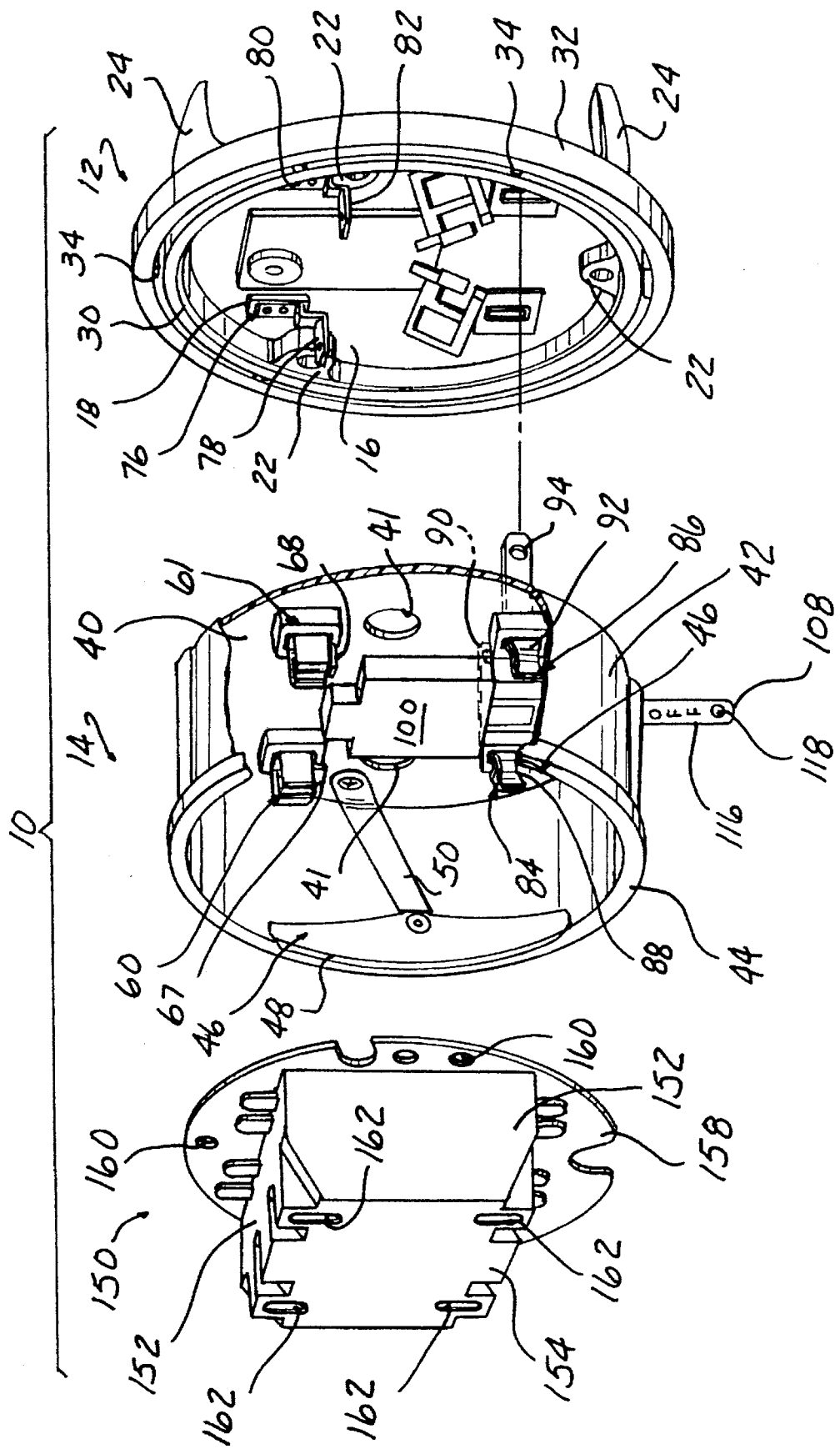
FIG. 1 is an exploded, perspective view showing a first embodiment of an electric service safety disconnect apparatus of the present invention.

In order to better describe and appreciate the advantages of the present invention, a description of the conventional construction of an electric watthour meter socket adapter or socket extender/adapter, both hereafter referred to as a socket adapter, will be provided with reference to FIG. 1. A conventional socket adapter 10 is designed to receive a conventional electric watthour meter, not shown, in a snap-in connection via mating contacts. The socket adapter 10 includes contacts described hereafter, which plug into mating contacts in a watthour meter socket. The number of contacts on the socket adapter 10, the watthour meter and the meter socket will vary depending upon the type of electric service at a particular user site. FIG. 1 depicts, by way of example only, a single phase electric service.

As shown in FIGS. 1–4, the socket adapter 10 includes a base portion 12 and a shell portion 14 which are fixedly joined together by suitable means, such as fasteners. The base 12 has a central wall 16 of generally circular shape. A plurality of generally rectangular bosses 18 are formed on the central wall 16 and have a slot 20 formed therein which extends completely through each boss 18 and the central wall 16 to receive a blade therethrough, as described hereafter. A plurality of cylindrical bosses 22 are also formed on and extend outward from one surface of the wall 16. Through bores are formed in each boss 22 for receiving a fastener to join the shell 14 to the base 12. A plurality of outwardly extending legs 24 are formed on a back surface of the wall 16 and are provided in an appropriate number and are spaced from one of the contacts or blade terminals which extends through the base 12.

An annular raised inner peripheral edge flange 30 is formed on the base 12 and extends outward from one surface of the central wall 16. An outer peripheral edge flange 32 is spaced radially outward from the inner flange 30. A plurality of circumferentially spaced ribs 34 extend radially between the inner and outer peripheral edge flanges 30 and 32.

The inner peripheral edge flange 30 includes an annular seat for receiving a peripheral edge portion of the shell 14 when the shell 14 is joined to the base 12. The outer peripheral edge flange 32 extends radially outward from the inner edge flange 30 and forms a mounting flange which mates with the mounting flange on the cover of the watthour meter socket, not shown. A conventional sealing ring, also not shown, is employed to surround and lockingly join the outer peripheral edge flange 32 to the mounting flange on the socket.

The shell 14 of the socket adapter 10 is formed with a bottom wall 40 and a generally annular sidewall 42. The sidewall 42 terminates in an enlarged diameter exterior end mounting flange 44. The mounting flange 44 is designed to mate with a corresponding mounting flange on a conventional watthour meter. A sealing ring, not shown, may be employed to encompass and lockingly connect the mounting flange 44 on the shell 14 and the mounting flange on a watthour meter. A pair of apertures 41 are formed in the bottom wall 40 between pairs of contact mounting bosses.

A pair of grounding straps 46 are mounted on opposite sides of the shell 14. Each grounding strap 46 has a peripheral edge portion 48 mounted on and extending over an edge of the exterior end mounting flange 44. A connector strap 50 is joined to the edge portion 48 and extends along the interior of the sidewall 42 of the shell 14 to a connection on the bottom wall 40 of the shell 14. The ground straps 46 provide a ground connection to the high voltage surge suppression circuit of the watthour meter.

A plurality of jaw type contacts are mounted in the shell 14. The contacts may be provided in any number depending upon the type of electrical service provided to a particular user site. In the exemplary, single phase embodiment, a pair of line contacts 60 and 61 and a pair of load contacts 84 and 86 are mounted in the shell 14.

Figure 3:
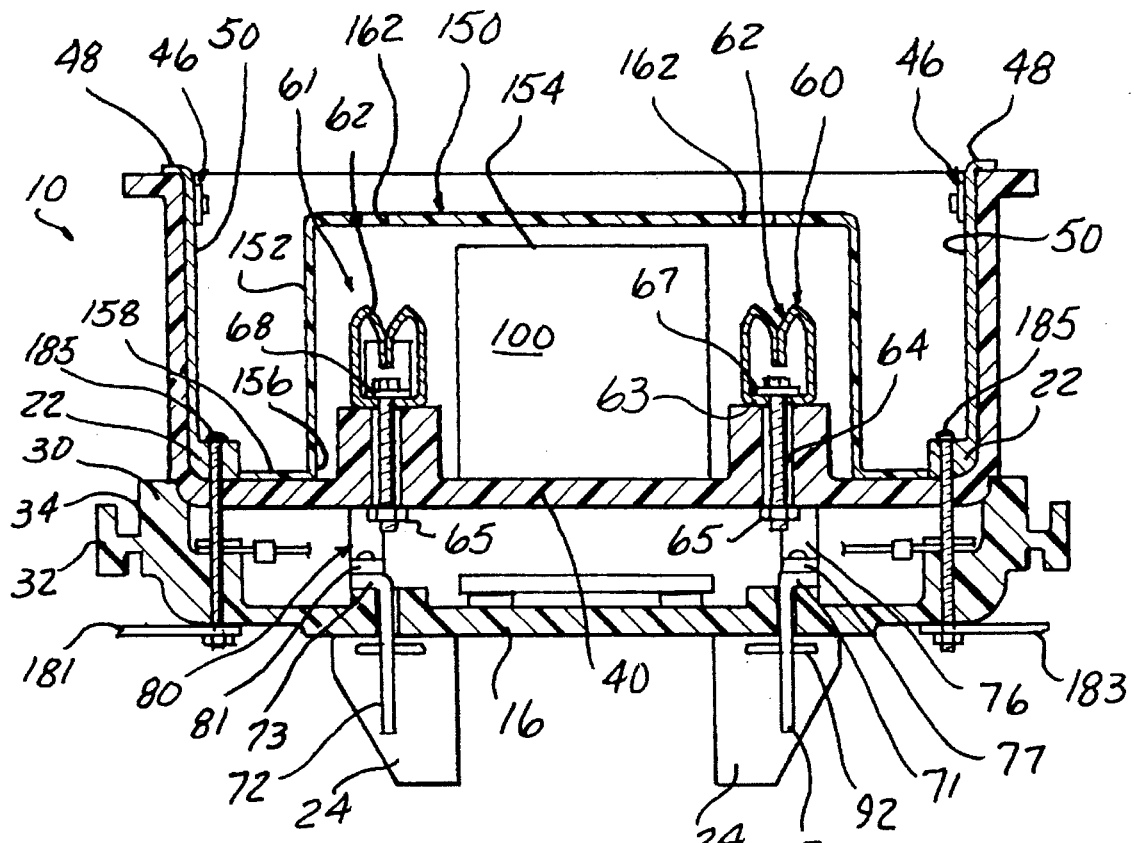
FIG. 3 is a cross sectional view generally taken along line 3—3 in FIG. 2 through the line contacts and line terminals of the assembled shell and base of the socket adapter.
Figure 4:
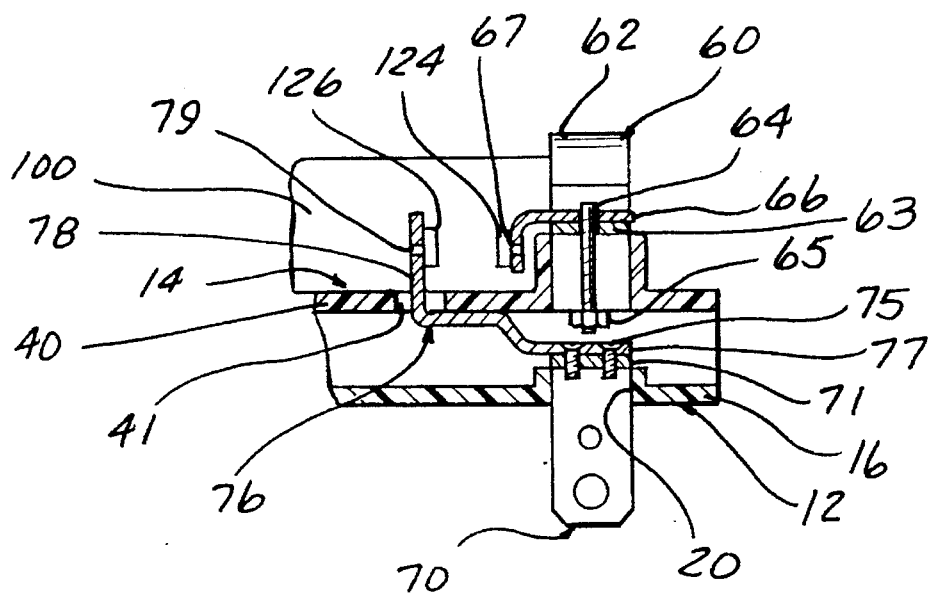
FIG. 4 is a partial, cross sectional view taken along line 4—4 in FIG. 2.
Figure 5:
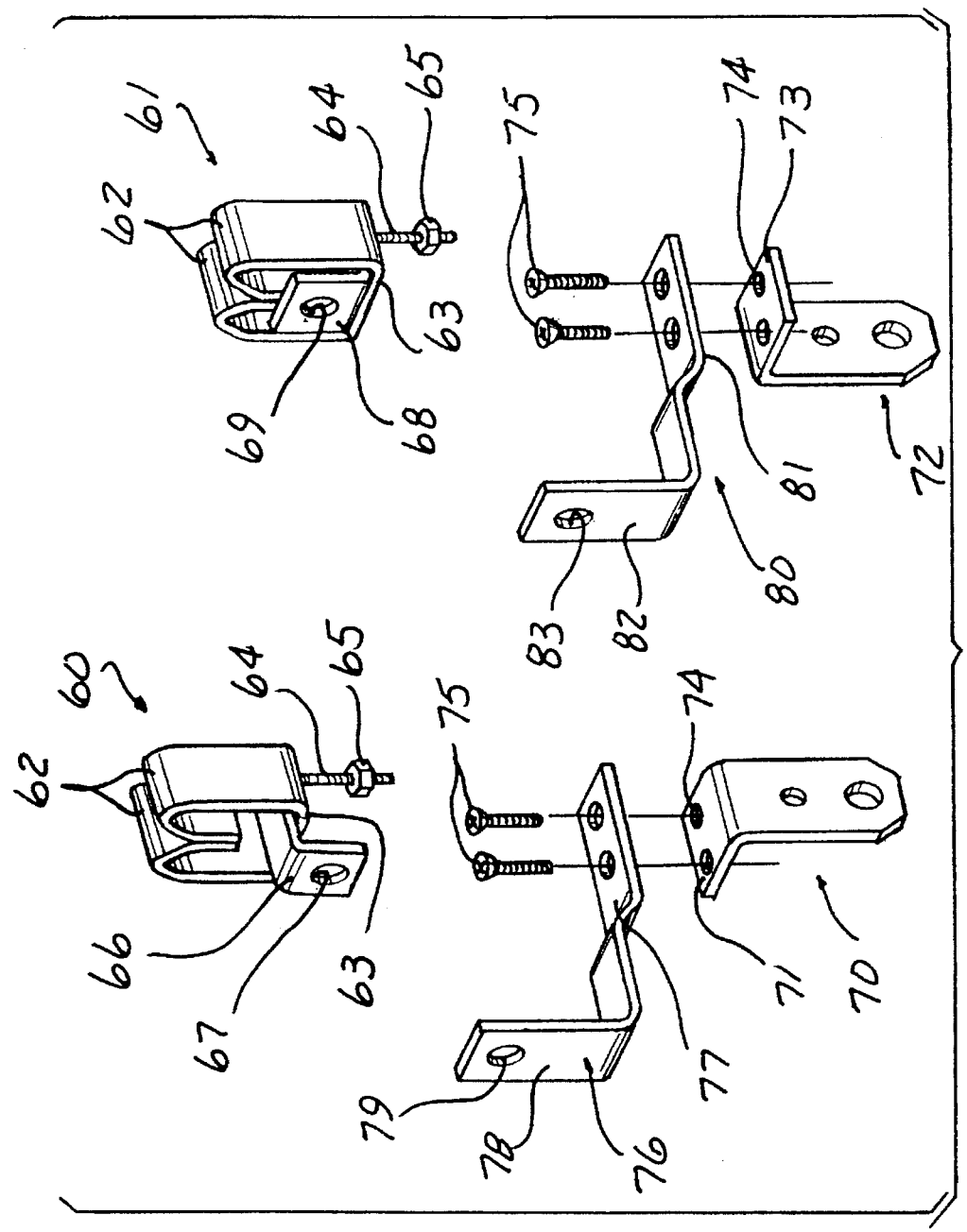
FIG. 5 is an exploded, perspective view of the line jaw contacts and line blade terminals.

Each line contact 60 and 61, as shown in greater detail in FIGS. 3, 4 and 5 has a female jaw portion designed to receive a blade terminal of a watthour meter in a plug-in, snap-together connection. Each line jaw contact 60 and 61 have a folded-over jaw design formed of two inward folded ends 62 which define a separable aperture for receiving a blade terminal of a watthour meter in a conventional manner. The folded-over ends 62 extend from sidewalls joined to a base 63. A fastener, such a threaded stud 64, extends centrally through the base 63 and receives a nut 65 for securing each jaw contact 60 or 61 on one of the mounting bosses formed on the bottom wall 40 of the shell 14.

A connector, such as connector 66 for jaw contact 60 and connector 68 for jaw contact 61, is mounted in each jaw contact 60 and 61 to provide connection between the respective jaw contacts 60 and 61 and terminals on a power disconnect means 100 described hereafter. The connectors 66 and 68 are formed of an electrically conductive material, such as copper, and have a generally rigid, L-shape, with one leg of the L depending downward for the connector 66 and one leg extending upward for the connector 68. Apertures 67 and 69 are formed in each of the connectors 66 and 68, respectively, for securing the connectors 66 and 68 to the terminals on the power disconnect means 100.

A pair of line blade terminals 70 and 72 are mounted in the base 12 and extend through the apertures 20 in the bosses 18 formed in the central wall 16 of the base 12. Each line blade terminal 70 and 72 has a generally L-shape with an elongated leg extending through the central wall 16 of the base 12 for insertion into a jaw contact in a watthour meter socket in a conventional manner. An aperture is formed in the elongated leg of each line blade terminal 70 and 72 for receiving a suitable fastener, such a cotter pin, for securing each blade terminal 70 and 72 to the base 12.

A connector 76 is attached to the line blade terminal 70 and a connector 80 is attached to the line blade terminal 72 for electrically connecting the line blade terminals 70 and 72 to certain terminals on the power disconnect means 100. Each of the connectors 76 and 80 is formed of an electrically conductive material and has a generally L-shape formed of two perpendicularly disposed legs. An intermediate step may be formed between the legs to provide clearance for components mounted internally within the socket adapter 10.

A pair of apertures 74 are formed in the short leg 71 of the jaw contact 70 and receive fasteners, such as screws 75, which extend through similar apertures formed in one leg 77 of the connector 76 to attach the connector 76 to the line blade terminal 70. Similar apertures 73 are formed in the short leg of the other line blade terminal 72 for securing one leg 81 of the connector 80 to the line blade terminal 72.

As shown in FIGS. 3 and 4, when each line blade terminal 70 and 72 are fixed mounted on the bottom wall 16 of the base 12, the connectors 76 and 80 extend through an interior chamber formed between the wall 16 of the base 12 and the central wall 40 of the shell 14. One leg 78 of the connector 76 and one leg 82 of the connector 80 pass through the apertures 41 formed in the central wall 40 of the shell 14 to a convenient position for easy connection by means of suitable fasteners to the terminals on a power disconnect means as shown in FIG. 4.

The connectors 66, 68, 76 and 80 are preferably formed of rigid bus bars, which have sufficient strength to support and mount the power disconnect means or circuit breaker 100 within the shell 14 without requiring additional fasteners and associated labor previously used to mount the power disconnect means or circuit breaker 100 on the bottom wall 40 of the shell 14. In addition, the rigid bus bars used to form the connectors 66, 68, 76 and 80 are capable of carrying higher currents thereby enabling a higher amperage breaker to be installed in the socket adapter 10.

Figure 2:
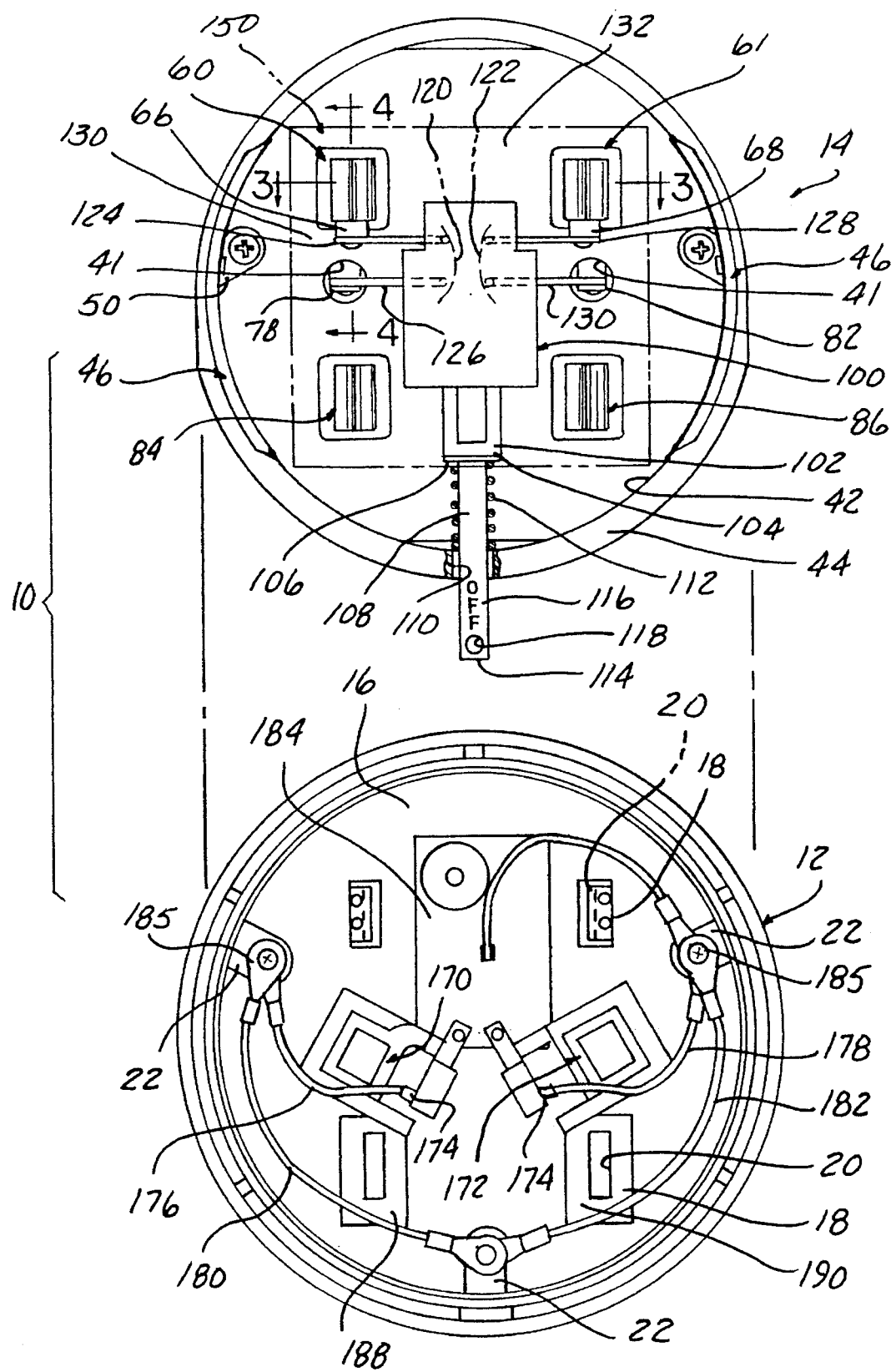
FIG. 2 is an offset, front elevational view showing the shell and base of the socket adapter of the safety disconnect depicted in FIG. 1.

As shown in FIGS. 1 and 2, a pair of load jaw blade terminals 84 and 86 are mounted in the socket adapter 10. Each load jaw blade terminal 84 and 86 is formed with a jaw portion and a blade terminal portion, such as jaw contact portion 88 and blade terminal portion 90 for the load jaw blade terminal 84 and jaw contact portion 92 and blade terminal portion 94 for the load jaw blade terminal 86. The load jaw blade terminals 84 and 86 are of conventional construction and are secured in position on mounting bosses on the central wall 16 of the base 12 and held in position by means of a suitable fastener, such as a cotter pin, extending through a aperture formed in the blade terminal portion 90 and 94 of each load jaw blade terminal 84 and 86.

A power disconnect means 100 is mounted in the shell 14 and selectively controls the supply of electrical power between the pair of line jaw contacts 60 and 62 and the line blade contacts 70 and 72. The power disconnect means 100 may take the form of a suitable circuit breaker, ground fault circuit interrupt device (GFCI), fuses, etc., which trips to an open non-power conducting state at a preset current level.

As shown in FIGS. 1, 2 and 3, where the power disconnect means 100 is in the form of a circuit breaker, the circuit breaker 100 is located between the pairs of line jaw contacts 60, 61 and load jaw blade terminals 84, 86 in the shell. The circuit breaker 100 includes a movable plunger 102 which extends outward from the housing of the circuit breaker 100. The plunger 102 is movable from an extended position shown in FIGS. 1 and 2 when the circuit breaker 100 is in an off or open, non-power conducting state toward the circuit breaker 100 to place the circuit breaker 100 in a closed, power conducting state.

The plunger 102 terminates in an exterior end 104 which engages an enlarged diameter end flange 106 formed on a movable rod 108. The rod 108, which preferably has a cylindrical shape, is movably mounted in an aperture 110 in the annular side wall 42 of the shell 14. A biasing means 112, such as a coil spring, is seated between the annular side wall 42 and the enlarged flange 106 to normally bias the rod 108 into contact with the end 104 of the plunger 102.

When the rod 108 is urged inward toward the circuit breaker 100, the circuit breaker closes to an "on" or conducting state. In this position, the outer end 114 of the rod 108 is substantially contained within the shell 14 or is disposed in close proximity with the annular side wall 42 of the shell 14.

When the circuit breaker 100 trips, the plunger 108, as shown in FIG. 2, moves in a direction sliding the end of the plunger 108 outward from the housing of the circuit breaker 100. This drives the outer end 114 of the rod 108 outward beyond the annular side wall 42 of the shell 14 until an end portion of the rod 108 is exposed exteriorly of the annular side wall 42 of the shell 14. Suitable indicia, such as the word "off" denoted by reference number 116, may be formed or placed on the exterior surface adjacent one end of the rod 108 to indicate that the circuit breaker 100 is deenergized or "off". This increases the safe use of the socket adapter 10 since the condition of the circuit breaker 100 is readily ascertainable exteriorly of shell 42 and a watthour meter mounted therein. A service person or homeowner can easily and quickly recognize that the circuit breaker 100 is "off" so as to safely make wiring connections within the building.

In addition, a bore 118 is formed laterally through the rod 108 and is located exteriorly of the side wall 42 of the shell 14 when the circuit breaker 100 is in the "off" or non-power conducting state. The bore 118 receives a lock means, such as a wire seal or a padlock. With the lock in place through the bore 118 in the rod 108, the rod 108 is prevented from being pushed inward into the shell 14 to switch the circuit breaker 100 to a power conducting state. This provides additional safety to any person making wiring connections in the building.

In the exemplary single phase service, the circuit breaker 100 includes a pair of switchable contacts 120 and 122. Each contact is connected to a pair of terminals mounted exteriorly on the housing of the circuit breaker 100, such as terminals 124 and 126 for the contact 120 and terminals 128 and 130 for the contact 122.

In a preferred embodiment of the present invention, the contacts 120 and 122 of the circuit breaker 100 are connected to the line side conductors to allow impedance of the power disconnect or circuit breaker sensing circuit to provide additional surge suppression to the watthour meter in order to reduce the magnitude of any voltage surge or transients before the voltage surge or transients reach the watthour meter or the surge suppression circuit described hereafter. Accordingly, the first terminals 124 and 128 of the contacts 120 and 122, respectively, are connected by the connectors 66 and 68, respectively, to the line jaw contacts 60 and 61, respectively, mounted in the shell 14.

The other terminals 126 and 130 of the circuit breaker contacts 120 and 122, respectively, are connected by connectors 76 and 80 to the line blade terminals 70 and 72, respectively, mounted in the base 12. The connection to the blade terminals 70 and 72 is by any suitable means, such as by a fastener extending through the connectors 76 and 80 to the end of the respective blade terminal 70 and 72 extending above the raised bosses 18 on the central wall 16 of the base 12.

It should be noted that one leg of the connectors 76 and 80 pass through the apertures 41 formed in the bottom wall 40 of the shell 14, with the remainder of each connector 76 and 80 disposed in the interior cavity formed between the bottom wall 40 of the shell 14 and the central wall 16 of the base 12.

In addition to a circuit breaker used to form the power disconnect means 100, a ground fault interrupt device (GFCI) may also be mounted in the shell 14. A suitable operator is mounted on the ground fault interrupt device to control the movement of the rod 108 in the same manner as described above for the circuit breaker.

As shown clearly in FIGS. 1 and 3, a safety shield 150 is in the form of a hollow housing having side walls 152, a closed front wall 154, an open back 156 and a peripheral flange 158 is mounted on the bottom wall 40 of the shell 14. The safety shield 150 is preferably molded of a plastic material as a single piece housing with a single, hollow, interior cavity in which the jaw contacts 60, 61, 84 and 86 are disposed when the safety shield 150 is mounted on the bottom wall 40 of the shell 14.

Apertures 160 are formed in the flange 158 and receive suitable fasteners, such as screws or plastic rivets, not shown, to securely mount the safety shield 150 on the bottom wall 40 of the shell 14.

A plurality of apertures, such as narrow slots 162, are also formed in at least the front wall 154 of the housing of the safety shield 150. The number and location of the apertures 162 are selected to correspond to the number and location of the jaw contacts 60, 61, 84 and 86 in the shell 14.

When the safety shield 150 is mounted to the bottom wall 40 of the shell 14 by means of fasteners extending through the apertures 160 in the mounting flanges 158 and the bottom wall 40 of the shell 14, one of the apertures or slots 162 will be aligned with each jaw contact 60, 61, 84 and 86 in the shell 14 thereby providing a narrow opening which allows the insertion of the blade terminals of a watthour meter therethrough into engagement with the jaw contacts 60, 61, 84 and 86. However, the safety shield 150 completely surrounds all of the remaining portions of the jaw contacts 60, 61, 84 and 86 thereby providing safety and/or a flash shield which prevents any inadvertent contact with the jaw contacts 60, 61, 84 and 86 which may be carrying potential.

As shown in FIGS. 1 and 2, surge suppression means in the form of a pair of surge suppression elements or devices 170 and 172 are mounted in the base 12 and electrically connected to the load jaw blade terminals 84 and 86 in the base 12. In a preferred embodiment, the surge suppression elements 170 and 172 are of metal oxide varistors having a generally flat, planar form.

As is conventional, such varistors 170 and 172 conduct at a predetermined voltage to conduct any voltage surges or transients imposed on the load jaw blade terminals 84 and 86 to ground thereby preventing such voltage surges or transients from being imposed the load distribution network. One or more additional varistors may also be connected in parallel with varistors 170 and 172.

As shown in FIG. 2, a lug 174 extends outward from the planar substrate on which each varistor 170 and 172 is mounted and provides electrical connection to a conductor 176 in the case of the varistor 170 and a conductor 178 in the case of the varistor 172. The conductors 176 and 178 are connected to the bosses 22 in the base 12 and to each other by additional conductors 180 and 182. The conductors 176, 178, 180 and 182 are connected to ground potential by fasteners 185 which pass through the bosses 22 on the bottom wall 40 of the shell 14 and the central wall 16 of the base 12 to ground tabs 181 and 183, respectively, extending outward from the back surface of the bottom 16 of the base 12, as shown in FIG. 3. The ground tabs 181 and 183 contact a ground contact in a watthour meter socket in a conventional manner to complete the ground path connection.

As an option, the lugs 174 may be fixedly mounted on a printed circuit board 184 fixedly mounted on the central wall 16 of the base 12 as described in U.S. Pat. No. 5,023,747. The circuit board 184 provides a suitable mounting surface for a detection and alarm circuit as described in said patent, the contents of which are incorporated herein by reference, The circuit provides an audible alarm to indicate when one or more of the varistors 172 and 174 has failed.

An opposite end of each varistor 170 and 172 is electrically connected to an electrical plate element 188 and 190, respectively. The plate elements 188 and 190 have an internal aperture sized to snugly receive one of the load blade terminals 90 or 94 of the load jaw blade contacts 84 and 86, respectively, so as to be disposed in electrical contact with the load blades 90 or 94. This provides an electrical connection between the load blades 90 and 94 and the varistors 170 and 172 for the aforementioned surge suppression.

Referring now to FIGS. 6 and 7, there is depicted another embodiment of the present invention. In this embodiment, the service disconnect is provided with two separate shells which respectively receive the power disconnect means 100 and the surge suppression means or varistors 170 and 172.

A housing 200 is formed of a front wall 202, an opposed, spaced, back wall or surface 204 and a peripheral side wall 206 interconnecting the front and back walls 202 and 204. The interconnected front and back walls 202 and 204 and the peripheral side wall 206 surround and form a hollow interior chamber within the housing 200.

A base 210 having an annular peripheral edge 212 is securely connected to the back wall 204 of the housing 200 by means of suitable fasteners. Alternately, the base 210 can be integrally formed as a unitary part of the housing 200 by molding, for example. The edge 212 engages the flange on the cover of a watthour meter socket and receives a conventional seal ring as is conventional.

A plurality of blade terminals, such as a pair of line blade terminals 214 and a pair of spaced, load blade terminals 216 are mounted in the base 210. As described above, the blade terminals 214 and 216 extend outward from the base 210 to engage the jaw contacts in a watthour meter socket in a snap-in connection.

A pair of spaced shells 220 and 222 are mounted on the front wall 202 of the housing 200 by means of suitable fasteners. The shells 220 and 222 are of substantially identical construction to the shell 14 described above and shown in FIGS. 1, 2 and 3; although the shell 222 may have other shapes.

The pair of line jaw contacts 60 and 61, and the pair of load jaw blade terminals 84 and 86 are mounted in the shell 220 in the same manner as described above. The load jaw portions of the jaw blade terminals 84 and 86 are integrally formed with the load blades 216 as described above. Further, the power disconnect means 100 is also mounted within the shell 220, with the movable rod 108 extending exteriorly through a side wall thereof. The contacts of the power disconnect means 100 are connected to the line jaws 60 and 61 and to the line blades 214 as described above and shown in FIG. 2.

The shell 220 is designed to receive a watthour meter therein in a conventional manner. The shell 222, on the other hand, receives a cover 224 having a peripheral mounting flange 226 engagable with a peripheral end flange 228 on the shell 222. A conventional sealing ring, not shown, may be mounted about the mated flanges 226 and 228 to fixedly and lockingly mount the cover 224 on the shell 222.

In this embodiment, the surge suppression means, such as the metal oxide varistors 170 and 172, are mounted in the shell 222 and disposed in electrical contact with the pair of load jaw blade terminals 84 and 86 in the shell 220 and are connected to ground as shown in FIG. 2.

It should be noted that the housing 200 is depicted in FIG. 6 as having a vertical orientation. Alternately, the housing 200 may also be formed for a horizontal mounting position with the plunger 108 extending downwardly from the shell 220. Both arrangements provide access to the metal oxide varistors 170 and 172 to enable easy replacement of the varistors 170 and 172 in case of damage thereto.

FIG. 7 depicts a schematic wiring diagram for the components mounted in the housing 200 shown in FIG. 6. The line blade terminals 214 in the base 210 are connected by the connectors 76 and 80 to the switchable contacts in the power disconnect means 100 mounted in the shell 220 as described above. The other terminals of each of the contacts in the power disconnect means 100 are connected by connectors 66 and 68 to the line jaw contacts 60 and 61 in the shell 220.

The load jaw contacts of the jaw blade terminals 84 and 86 in the shell 220, which receive the load blade terminals of the watthour meter, are integrally formed with the load blade terminals 216 in the base 210. The surge suppression varistors 170 and 172 are also connected to the load blade terminals 216 and to ground as shown in FIG. 2.

In summary, there has been disclosed a unique electrical service safety disconnect which provides both overvoltage and overcurrent protection to a building electric power service. The overvoltage and overcurrent elements are mounted in a conventional watthour meter socket adapter for easy connection to existing power line conductors and building load distribution network without requiring any movement of the building wiring. The power disconnect means is mounted on the line side between the line blade terminals and line jaw contacts to provide overcurrent protection and additional impedance before the watthour meter mounted in the socket adapter so as to reduce the magnitude of any voltage surges or transients before such surges or transients reach the watthour meter. The surge suppression elements are electrically connected between the load jaw blade terminals and ground after the watthour meter to allow the air gap surge suppression in the watthour meter to protect the varistors and to suppress any high voltage surges or transients from the load distribution network. This provides protection for the load distribution network, particularly where the wire gauge used in the load distribution network is small or old.

The socket adapter also includes a power lockout feature which locks the power disconnect means in an off or open position thereby providing the ability to make safe, power off wiring connections within the building.

The use of rigid bus bar type connectors to electrically connect the terminals of the power disconnect means or circuit breaker to the line jaw contacts and the line blade terminals provides a convenient means for supporting and mounting the power disconnect means or circuit breaker in the socket adapter housing. This eliminates any separate fasteners and the associated labor to fixedly mount the circuit breaker on the bottom of the shell of the socket adapter housings as encountered in previous circuit breaker mounting arrangements.

What is claimed is:

1. An electrical service protection and disconnect apparatus mountable in a watthour meter socket having a plurality of jaw contacts connected to electrical line conductors and electrical load conductors and normally receiving a watthour meter, the apparatus comprising:

a housing;

a plurality of line and load jaw contacts mounted in the housing for receiving line and load blade terminals of a watthour meter;

a plurality of line and load blade terminals mounted in the housing and extending outward from the housing for insertion into jaw contacts of a watthour meter socket;

electrical power disconnect means, mounted in the housing and connected between the line blade terminals and the line jaw contacts, for selectively controlling the application of power to the line jaw contacts in the housing; and surge suppression means, mounted in the housing and electrically connected between ground potential and each load blade terminal, for conducting electrical surges to ground.

2. The apparatus of claim 1 wherein the housing comprises:

a base having a central wall and a peripheral edge; and a shell having a bottom wall fixedly mounted on the peripheral edge of the base and an annular side wall extending axially from the base.

3. The apparatus of claim 2 wherein:

the line blade terminals are mounted in the central wall of the base; and the line jaw contacts are mounted in the bottom wall of the shell.

4. The apparatus of claim 3 wherein the electrical power disconnect means comprises:

a first switchable contact connected between first and second terminals; and a second switchable contact connected between first and second terminals.

5. The apparatus of claim 4 further comprising:

means for electrically connecting the first terminals of the first and second switchable contacts of the power disconnect means to the line blade terminals, and for connecting the second terminals of the first and second switchable contacts of the power disconnect means to the line jaw contacts.

6. The apparatus of claim 5 wherein the electrically connecting means comprises:

first and second electrical connectors, each electrically connected between one line blade terminal and a first terminal of the first and second switchable contacts; and third and forth electrical connectors, each electrically connected between one line jaw contact and one second terminal of the first and second switchable contacts.

7. The apparatus of claim 6 wherein the first, second, third and forth electrical connectors comprise:

rigid, electrically conductive bus bars.

8. The apparatus of claim 7 wherein:

apertures are formed in the bottom wall of the shell; and a portion of the first and second electrical connectors extend through the apertures and are electrically connected to the first terminals of the first and second switchable contacts and the line blade terminals.

9. The apparatus of claim 7 wherein:

the bus bars are fixedly connected to the first and second terminals of the power disconnect means to support the power disconnect means in the shell.

10. The apparatus of claim 1 wherein:

each load blade terminal and each load jaw contact are unitarily form as a one piece jaw blade having a jaw contact end and an opposed blade terminal end.

11. The apparatus of claim 2 wherein:

the central wall of the base is spaced from the bottom wall of the shell when the shell is fixedly connected to the base to form an interior chamber therebetween; and the surge suppression means mounted in the interior chamber.

12. The apparatus of claim 11 wherein the surge suppression means comprises:

a plurality of metal oxide varistors; and means for electrically connecting at least one metal oxide varistor to one of the load blade terminals.

13. The apparatus of claim 1 wherein the electrical power disconnect means comprises:

a circuit breaker switchable to an open, non-power conducting state at a predetermined current level.

14. The apparatus of claim 1 further comprising:

means for locking the electrical power disconnect means in a non-power conducting state, the locking means positioned exteriorly of the housing.

15. The apparatus of claim 14 wherein:

the electrical power disconnect means includes a plunger movable between at least two positions corresponding respectively to power conducting and non-power conducting states of the electrical power disconnect means;

the plunger having a length to slidably extend exteriorly through an aperture in the housing, with an end portion of the plunger disposed exteriorly of the housing when the power disconnect means is in the non-power conducting state; and the locking means adapted to be coupled to the end portion of the plunger when the end portion of the plunger is disposed exteriorly of the housing.

16. The apparatus of claim 15 further comprising:

indicia disposed on the end portion of the plunger and visible exteriorly of the housing when the electrical power disconnect means is in the non-power conducting state to indicate that the electrical power disconnect means is in the non-power conducting state.

17. The apparatus of claim 16 wherein the locking means comprises:

an aperture formed in the end portion of the plunger, the aperture disposed externally of the housing when the electrical power disconnect means is in the non-power conducting state and adapted to receive the locking means therethrough.

18. The apparatus of claim 1 wherein the electrical power disconnect means comprises:

a ground fault circuit interrupter.

19. The apparatus of claim 1 wherein the housing comprises:

a watthour meter receiving housing portion;

the electrical power disconnect means mounted in the watthour meter receiving housing portion;

an auxiliary housing separate from the watthour meter receiving housing portion;

the surge suppression means mounted in the auxiliary housing;

electrical conductor means for electrically connecting the load jaw contacts in the watthour meter receiving housing portion to the surge suppression means in the auxiliary housing and to ground potential; and a cover removably attachable to the auxiliary housing for closing access to the interior of the auxiliary housing.

20. The apparatus of claim 1 further comprising:

a base mounted on the housing, a plurality of line and load blade terminals mounted in the base and extending exteriorly of the base for insertion into jaw contacts in a watthour meter socket;

a watthour meter receiving first shell mounted on the housing for receiving a watthour meter, the electric power disconnect means and the line and load jaw contacts mounted in the first shell;

an auxiliary housing including a second shell mounted on the housing adjacent to the first shell, the surge suppression means mounted in the second shell; and electrical conductor means for connecting the line blade terminals in the base to the electrical power disconnect means in the first shell, for connecting the electrical power disconnect means to the line jaw contacts in the first shell, for connecting the load jaw contacts in the first shell to the surge suppression means in the second shell, and for connecting the surge suppression means to the line blade terminals in the base and to ground potential.

21. The apparatus of claim 20 further comprising:

cover means, removably mounted on the second shell, for closing the interior of the second shell.

22. An electrical service protection and disconnect apparatus mountable in a watthour meter socket having a plurality of jaw contacts connected to electrical line conductors and electrical load conductors and normally receiving a watthour meter, the apparatus comprising:

a housing including a base having a central wall and a peripheral edge, and a shell having a bottom wall fixedly mounted on the peripheral edge of the base and an annular side wall extending axially from the base, the central wall of the base is spaced from the bottom wall of the shell when the shell is fixedly connected to the base to form an interior chamber therebetween;

a plurality of line and load jaw contacts mounted in the shell for receiving line and load blade terminals of a watthour meter;

a plurality of line and load blade terminals mounted in the base and extending outward from the base for insertion into jaw contacts of a watthour meter socket;

the load blade terminals electrically connected to the load jaw contacts;

electrical power disconnect means, mounted in the shell and serially connected between the line blade terminals and the line jaw contacts, for selectively controlling the application of power to the line jaw contacts in the shell; and surge suppression means, mounted in the interior chamber and electrically connected between ground potential and each load blade terminal, for conducting electrical surges to ground.

23. An electrical service protection and disconnect apparatus mountable in a watthour meter socket having a plurality of jaw contacts connected to electrical line conductors and electrical load conductors and normally receiving a watthour meter, the apparatus comprising:

a housing;

a plurality of line and load jaw contacts mounted in the housing for receiving line and load blade terminals of a watthour meter;

a plurality of line and load blade terminals mounted in the housing and extending outward from the housing for insertion into jaw contacts of a watthour meter socket;

electrical power disconnect means, mounted in the housing and connected between the line blade terminals and the line jaw contacts, for selectively controlling the application of power to the line jaw contacts in the housing, the electrical power disconnect means including:

a first switchable contact connected between first and second terminals;

a second switchable contact connected between first and second terminals; and means for electrically connecting the first terminal of the first and second switchable contacts of the power disconnect means to each of the line blade terminals, for connecting the second terminal of the first and second switchable contacts of the power disconnect means to each of the line jaw contacts, the electrically connecting means fixedly mounting the power disconnect means in the housing.

24. The apparatus of claim 23 further comprising:

rigid, electrically conductive bus bars fixedly connected to and extending between the first and second terminals of the switchable contacts of the power disconnect means and the associated line and load blade terminals and line and load jaw contacts.

* * * * *